US011705433B2

(12) United States Patent
Nakashiba

(10) Patent No.: US 11,705,433 B2
(45) Date of Patent: Jul. 18, 2023

(54) SEMICONDUCTOR DEVICE

(71) Applicant: RENESAS ELECTRONICS CORPORATION, Tokyo (JP)

(72) Inventor: Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 64 days.

(21) Appl. No.: 17/380,653

(22) Filed: Jul. 20, 2021

(65) Prior Publication Data

US 2023/0023018 A1 Jan. 26, 2023

(51) Int. Cl.
*H01L 25/065* (2023.01)
*H01L 23/522* (2006.01)
*H01L 23/00* (2006.01)

(52) U.S. Cl.
CPC ...... *H01L 25/0657* (2013.01); *H01L 23/5227* (2013.01); *H01L 24/32* (2013.01); *H01L 2224/32145* (2013.01); *H01L 2225/06531* (2013.01); *H01L 2225/06544* (2013.01)

(58) Field of Classification Search
CPC ............. H01L 25/0657; H01L 24/32; H01L 2224/32145; H01L 2225/06531; H01L 2225/06544; H10B 80/00
See application file for complete search history.

(56) References Cited

U.S. PATENT DOCUMENTS

2016/0197066 A1* 7/2016 Uchida ................... H01L 28/10
   438/3
2019/0371727 A1* 12/2019 Kuwabara ............... H01L 28/10

FOREIGN PATENT DOCUMENTS

JP 2016-127162 A 7/2016

* cited by examiner

*Primary Examiner* — Timor Karimy
(74) *Attorney, Agent, or Firm* — McDermott Will & Emery LLP

(57) ABSTRACT

A semiconductor device includes a first semiconductor chip, an adhesive layer that is formed on the first semiconductor chip, and a second semiconductor chip that is arranged on the first semiconductor chip via the adhesive layer. The first semiconductor chip has a first semiconductor substrate and a first wiring layer. The first wiring layer has a first inductor and a first electrode pad. The first wiring layer is formed on the first semiconductor substrate. The second semiconductor chip has a second wiring layer and a second semiconductor substrate. The second wiring layer is formed on the first wiring layer via the adhesive layer. The second semiconductor substrate is formed on the second wiring layer, and has a first opening. In a plan view, the first electrode pad is formed so as not to overlap with the second semiconductor chip, and a second electrode pad overlaps with the first opening.

12 Claims, 11 Drawing Sheets

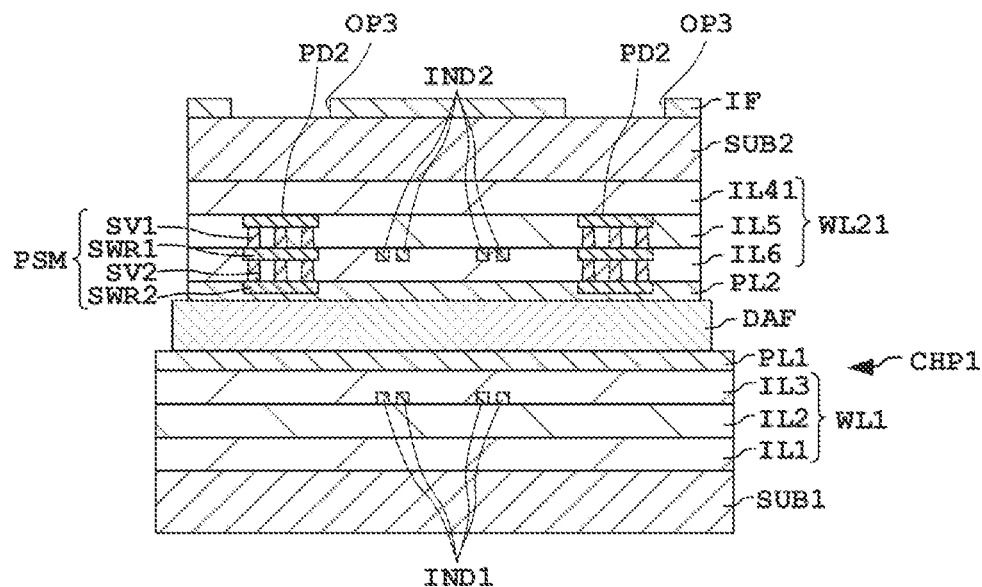
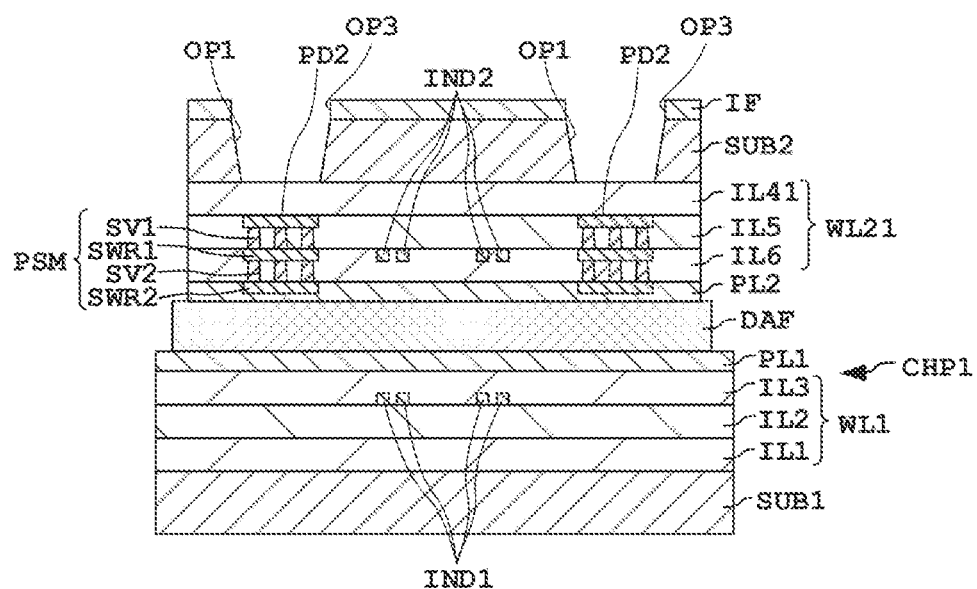

SEMICONDUCTOR DEVICE

BACKGROUND

The present invention relates to a semiconductor device, for example, a semiconductor device that has inductors.

A semiconductor device that includes a first inductor electrically connected to a semiconductor element for electric power and a second inductor electrically connected to a semiconductor element for a microcomputer (MCU) is known (for example, see Patent Document 1). Here, a drive voltage of the semiconductor element for electric power is about several hundred volts. On the other hand, a drive voltage of the semiconductor element for the MCU is about several volts. For this reason, if the semiconductor element for electric power described above and the semiconductor element for the MCU described above are connected to each other, the semiconductor element for the MCU may be damaged.

The semiconductor device described in Patent Document 1 is manufactured by bonding a first semiconductor chip having the first inductor described above and a second semiconductor chip having the second inductor described above each other via an insulating sheet (or an adhesive layer). The first inductor and the second inductor face each other via the insulating sheet. This makes it possible to transmit signals to each other between the semiconductor element for electric power and the semiconductor element for the MCU by electromagnetic induction coupling via the first inductor and the second inductor. The semiconductor element for the MCU is electrically insulated from the semiconductor element for electric power. For this reason, the semiconductor element for the MCU is not damaged due to a difference between the drive voltage of the semiconductor element for electric power and the drive voltage of the semiconductor element for the MCU.

There are disclosed techniques listed below.
[Patent Document 1] Japanese Unexamined Patent Application Publication No. 2016-127162

SUMMARY

The semiconductor device described in Patent Document 1 is configured so that a part of the first semiconductor chip and a part of the second semiconductor chip are not overlapped each other. This makes it possible to expose bonding pads of the first semiconductor chip and bonding pads of the second semiconductor chip for wire bonding connection.

However, there is room for improvement in the semiconductor device described above from the viewpoint of miniaturization.

It is an object of an embodiment to further miniaturize a semiconductor device. The other object and new feature will become apparent from description of the present specification and the accompanying drawings.

A semiconductor device according to an embodiment includes a first semiconductor chip, an adhesive layer formed on the first semiconductor chip, and a second semiconductor chip arranged on the first semiconductor chip via the adhesive layer. The first semiconductor chip includes: a first semiconductor substrate; and a first wiring layer formed on the first semiconductor substrate, the first wiring layer having a first inductor and a first electrode pad electrically connected to the first inductor. The second semiconductor chip includes: a second wiring layer formed on the first wiring layer via the adhesive layer, the second wiring layer having a second inductor that faces the first inductor and a second electrode pad connected to the second inductor; and a second semiconductor substrate formed on the second wiring layer, the second semiconductor substrate having a first opening. The first electrode pad is formed so as not to overlap with the second semiconductor chip in a plan view. The second electrode pad overlaps with the first opening in the plan view.

According to the embodiments, it is possible to miniaturize a semiconductor device.

BRIEF DESCRIPTION OF THE DRAWINGS

FIG. 8 is a sectional view illustrating one example of still another process included in the method of manufacturing the semiconductor device according to the first embodiment.

FIG. 9 is a sectional view illustrating one example of still another process included in the method of manufacturing the semiconductor device according to the first embodiment.

DETAILED DESCRIPTION

Figure 1:
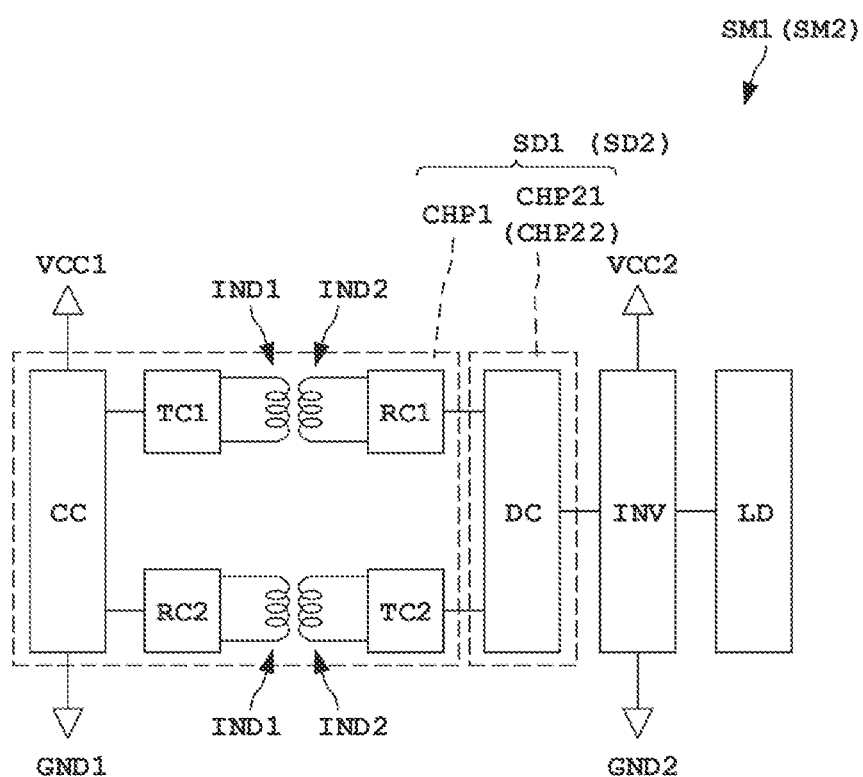
FIG. 1 is a block diagram illustrating one example of a configuration of a semiconductor module according to first and second embodiments.

Hereinafter, a semiconductor device according to each of embodiments will be described in detail with reference to the drawings. Note that in the specification and the drawings, the same reference numeral is assigned to the same component or corresponding component, and duplicate explanation thereof will be omitted. Further, in the drawings, for convenience of explanation, a configuration may be omitted or simplified. From the viewpoint of visibility, hatching may be attached even in a plan view. Moreover, a sectional view is illustrated as an end view.

First Embodiment (Configuration of Semiconductor Module)

FIG. 1 is a block diagram illustrating one example of a configuration of a semiconductor module SM1 according to a first embodiment.

As illustrated in FIG. 1, the semiconductor module SM1 includes a semiconductor device SD1, an inverter INV, and a load LD. The semiconductor device SD1 includes a first semiconductor chip CHP1 and a second semiconductor chip CHP21.

The first semiconductor chip CHP1 includes a control circuit CC, a first transmitting circuit TC1, a second transmitting circuit TC2, two first inductors IND1, two second inductors IND2, a first receiving circuit RC1, and a second receiving circuit RC2. The second semiconductor chip CHP21 includes a second inductor IND2 and a driving circuit DC.

The control circuit CC outputs a signal for controlling the driving circuit DC. A signal from the driving circuit DC is inputted into the control circuit CC. The control circuit CC is electrically connected to each of the first transmitting circuit TC1 and the second receiving circuit RC2. The control circuit CC is configured so that a first power supply potential VCC1 is applied to the control circuit CC, and the control circuit CC is connected and grounded to a first ground potential GND1. The first power supply potential VCC1 is about several volts, for example.

The first transmitting circuit TC1 transmits the signal from the control circuit CC to the first receiving circuit RC1. The first transmitting circuit TC1 is electrically connected to the corresponding first inductor IND1. The first transmitting circuit TC1 transmits the signal toward the corresponding first inductor IND1.

The first receiving circuit RC1 receives the signal from the first transmitting circuit TC1. The first receiving circuit RC1 is electrically connected to the corresponding second inductor IND2. The first receiving circuit RC1 receives the signal from the first transmitting circuit TC1 via an inductive coupling (or a magnetic coupling) of the corresponding first inductor IND1 and the corresponding second inductor IND2.

The second transmitting circuit TC2 transmits the signal from the driving circuit DC toward the corresponding second inductor IND2. The second transmitting circuit TC2 is electrically connected to the second inductor IND2. The second transmitting circuit TC2 transmits the signal toward the second inductor IND2.

The second receiving circuit RC2 receives the signal from the second transmitting circuit TC2. The second receiving circuit RC2 is electrically connected to the corresponding first inductor IND1. The second receiving circuit RC2 receives the signal from the second transmitting circuit TC2 via an inductive coupling of the corresponding first inductor IND1 and the corresponding second inductor IND2.

The driving circuit DC transmits a signal for driving the inverter INV to the inverter INV on the basis of the signal from the control circuit CC. The driving circuit DC is electrically connected to the inverter INV. The driving circuit DC is configured so that a second power supply potential VCC2 is applied to the driving circuit DC, and the driving circuit DC is connected and grounded to a second ground potential GND2. The second power supply potential VCC2 is higher than the first power supply potential VCC1. The second power supply potential VCC2 is about several hundred volts, for example. A potential difference between the second power supply potential VCC2 and the first power supply potential VCC1 is higher than 800 volts, for example.

The inverter INV controls the load LD. The inverter INV is electrically connected to the load LD.

The load LD is a motor, for example.

Note that each of a configuration of the first semiconductor chip CHP1 and a configuration of the second semiconductor chip CHP21 is not limited particularly. For example, the second semiconductor chip CHP21 may include a first transmitting circuit TC1, a second transmitting circuit TC2, first inductors IND1, second inductors IND2, a first receiving circuit RC1, and a second receiving circuit RC2.

In the semiconductor module SM1, transmission and reception of the signals are executed via the first inductors IND1 and the second inductors IND2. As a result, the transmission and reception of the signals are executed in a state where the control circuit CC driven at a low voltage and the driving circuit DC driven at a high voltage are electrically isolated from each other. As a result, it is possible to prevent the control circuit CC from being damaged due to a voltage difference between a drive voltage of the control circuit CC and a drive voltage of the driving circuit DC.

(Configuration of Semiconductor Device)

Figure 2:
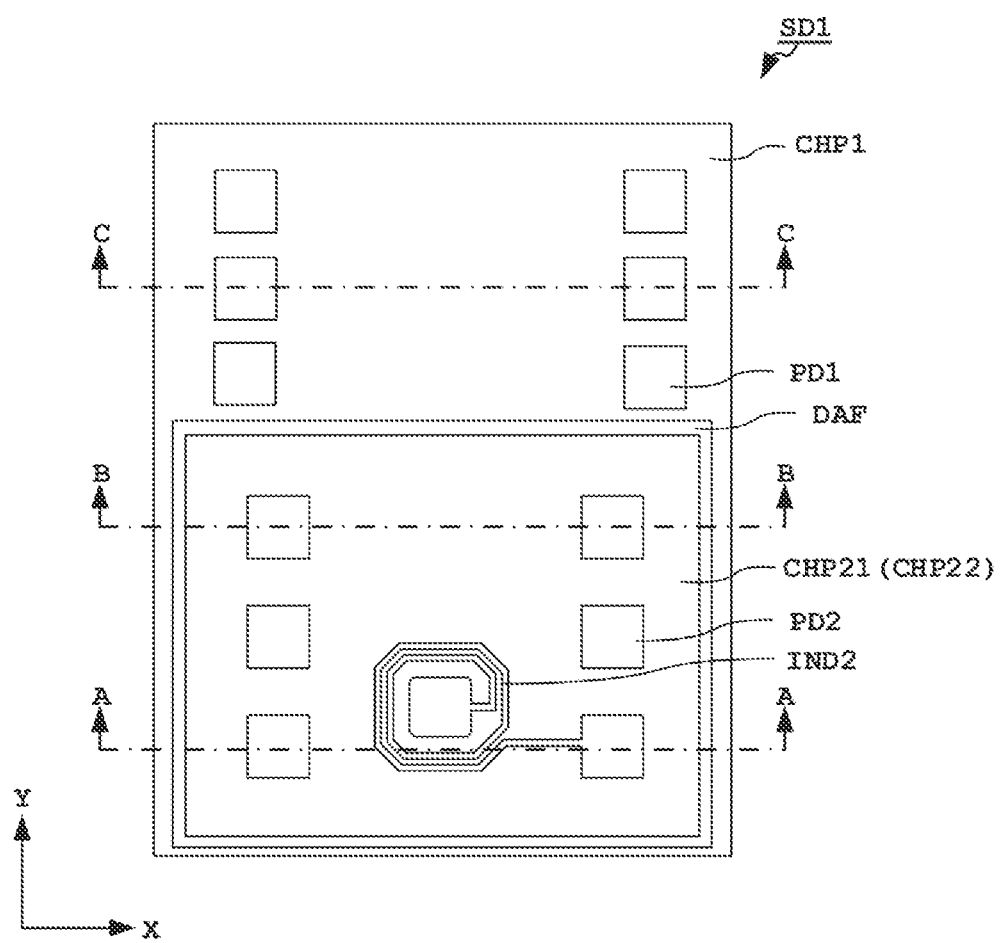
FIG. 2 is a plan view illustrating one example of a configuration of a main part of the semiconductor device according to the first embodiment.
Figure 3:
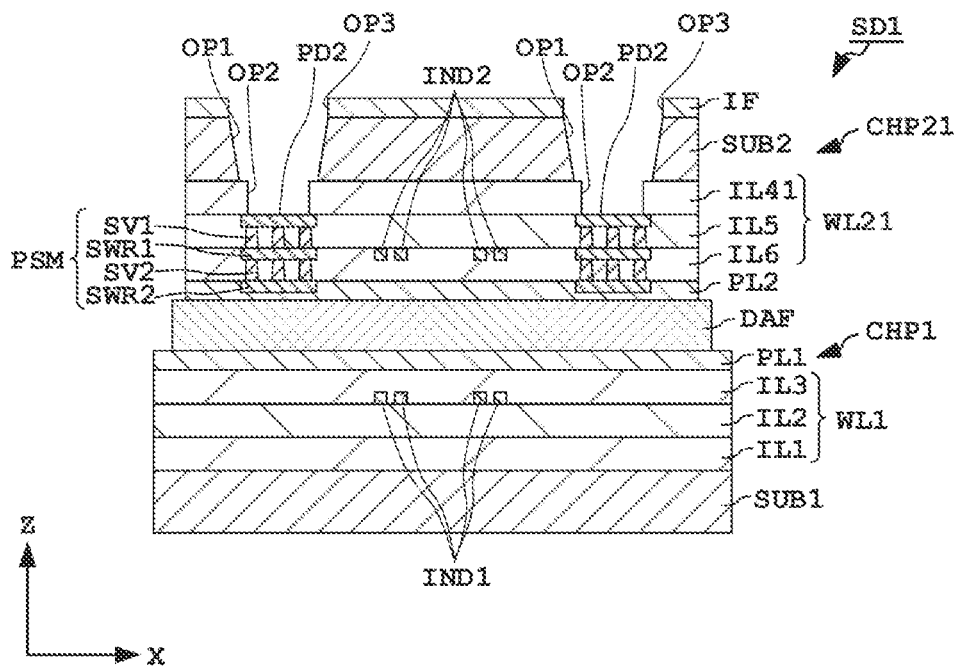
FIG. 3 is a sectional view illustrating one example of the configuration of the main part of the semiconductor device according to the first embodiment.
Figure 4:
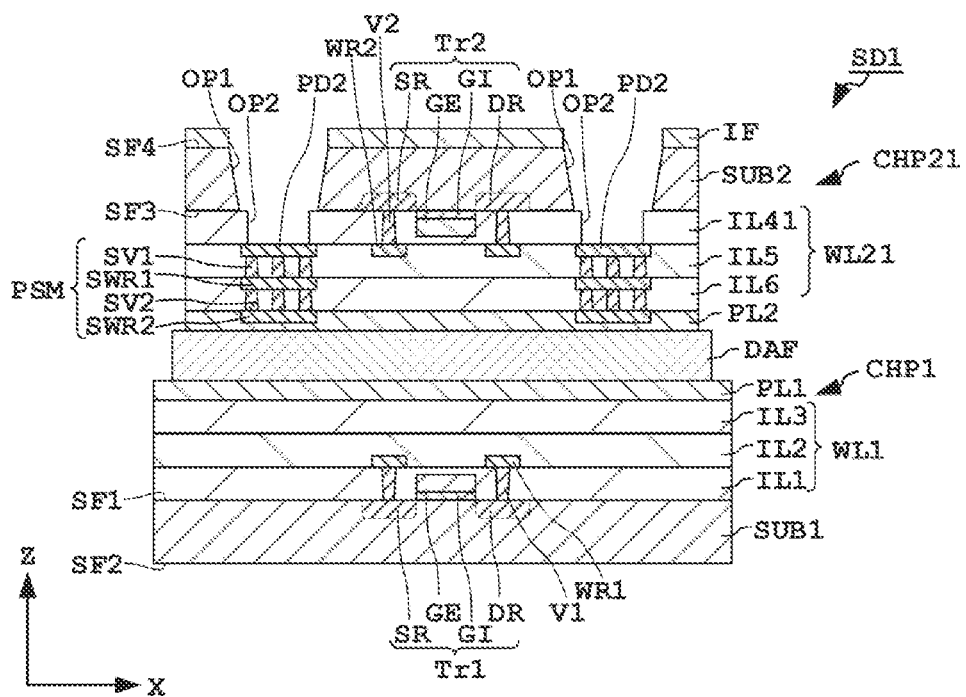
FIG. 4 is a sectional view illustrating one example of the configuration of the main part of the semiconductor device according to the first embodiment.
Figure 5:
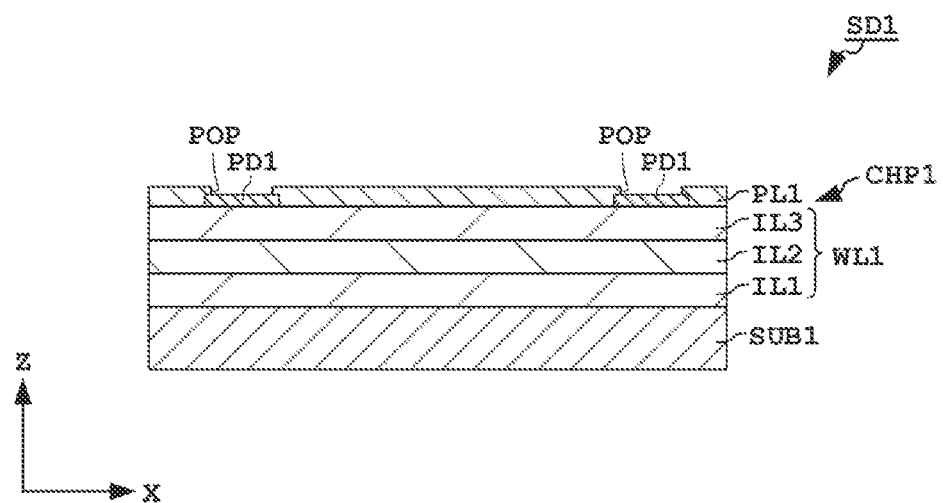
FIG. 5 is a sectional view illustrating one example of the configuration of the main part of the semiconductor device according to the first embodiment.

FIG. 2 is a plan view illustrating one example of a configuration of a main part of the semiconductor device SD1 according to the first embodiment. FIG. 3, FIG. 4 and FIG. 5 are sectional views illustrating one example of the main part of the semiconductor device SD1. FIG. 3 is a sectional view taken along a line A-A of FIG. 2. FIG. 4 is a sectional view taken along a line B-B of FIG. 2. FIG. 5 is a sectional view taken along a line C-C of FIG. 2.

In FIG. 2 to FIG. 5, each of an X direction and a Y direction is along a principal surface (a first surface SF1) of a first semiconductor substrate SUB1. A Z direction is a laminating direction of the first semiconductor chip CHP1 and the second semiconductor chip CHP21. The Z direction is a direction from one side of each of the first inductors IND1 and the second inductors IND2 toward the other side. The X direction, the Y direction, and the Z direction are orthogonal to each other.

The semiconductor device SD1 includes the first semiconductor chip CHP1, the second semiconductor chip CHP21, and an adhesive layer DAF. The first semiconductor chip CHP1 and the second semiconductor chip CHP21 are bonded to each other via the adhesive layer DAF so that the first inductors IND1 and the second inductors IND2 face each other.

In a plan view, a size of the first semiconductor chip CHP1 is larger than a size of the second semiconductor chip CHP21. In the plan view, the first semiconductor chip CHP1 overlaps with the whole second semiconductor chip CHP21.

The first semiconductor chip CHP1 includes the first semiconductor substrate SUB1, a first transistor Tr1, a first wiring layer WL1, and a first protective layer PL1.

The first semiconductor substrate SUB1 has a first surface SF1 (principal surface) and a second surface SF2 opposite to the first surface SF1. The first transistor Tr1 is formed on the first surface SF1 of the first semiconductor substrate SUB1 as a semiconductor element. Material of the first semiconductor substrate SUB1 is monocrystalline silicon (Si), for example.

The first transistor Tr1 may be included in any of the control circuit CC, the first transmitting circuit TC1, the first receiving circuit RC1, the second transmitting circuit TC2, and the second receiving circuit RC2, for example. The first transistor Tr1 is configured by a gate insulating film GI, a gate electrode GE, a source region SR, and a drain region DR. The gate electrode GE is formed on the first semiconductor substrate SUB1 via the gate insulating film GI. The source region SR and the drain region DR are respectively formed at both sides of the gate electrode GE in a plan view.

The first wiring layer WL1 is formed on the first surface SF1 of the first semiconductor substrate SUB1. The first wiring layer WL1 is configured by two or more wiring layers. The first wiring layer WL1 is a layer that has one or both of an insulating layer, and a wiring and a via (referred to also as a "plug") formed in the insulating layer. Here, the wiring is a conductor for transmitting an electric signal.

The first wiring layer WL1 includes a first insulating layer IL1, a second insulating layer IL2, the first inductors IND1, a third insulating layer IL3, a first via (or a first plug) V1, a first wiring WR1, and first electrode pads PD1.

The first insulating layer IL1 is formed on the first surface SF1 of the first semiconductor substrate SUB1. A thickness of the first insulating layer IL1 is 1 μm or thicker and 3 μm or thinner, for example. Material of the first insulating layer IL1 is silicon oxide, for example.

The second insulating layer IL2 is formed on the first insulating layer IL1. Examples of a thickness and material of the second insulating layer IL2 are similar to those of the first insulating layer IL1.

The first inductors IND1 are formed directly on the second insulating layer IL2. Each of the first inductors IND1 is electrically connected to the first transistor Tr1. In a plan view, a shape of each of the first inductors IND1 may be the same as a shape of each of the second inductors IND2, or may be different from the shape. In the present embodiment, in the plan view, the shape of each of the first inductors IND1 is the same as the shape of each of the second inductors IND2. In a plan view, the shape of the first inductor IND1 is a spiral shape, for example. Material of the first inductor IND1 is aluminum or copper, for example.

The third insulating layer IL3 is formed on the second insulating layer IL2 so as to cover the first inductors IND1. Examples of a thickness and material of the third insulating layer IL3 are similar to those of the first insulating layer IL1.

The first via V1 is formed in the first insulating layer IL1 so as to reach the source region SR or the drain region DR. Although it is not illustrated in the drawings particularly, the first via V1 may be formed in the second insulating layer IL2 or the third insulating layer IL3 so as to connect two wirings respectively formed in different insulating layers to each other. The first via V1 has a barrier film and a conducting film formed on the barrier film, for example. Examples of material of the barrier film include titanium (Ti), titanium nitride (TiN), tantalum (Ta), and tantalum nitride (TaN). Examples of material of the conducting film include tungsten (W) and aluminum (Al).

The first wiring WR1 is formed on the first insulating layer IL1. The first wiring WR1 may be formed on the second insulating layer IL2 or the third insulating layer IL3. With respect to the first wiring WR1, a known configuration adopted as a wiring in a semiconductor technology can be adopted. The first wiring WR1 is a laminated film in which barrier metal, a conducting film, and barrier metal are laminated in this order, for example. Examples of material of the barrier metal include titanium (Ti), titanium nitride (TiN), tantalum (Ta), and tantalum nitride (TaN). Examples of material that constitutes the conducting film include aluminum and copper.

The first electrode pads PD1 are formed directly on the third insulating layer IL3. The first electrode pads PD1 are electrically connected to the first inductors IND1 and the first transistor Tr1, respectively. The first electrode pads PD1 are formed so as not to overlap with each of the second semiconductor chip CHP21 and the adhesive layer DAF in a plan view. As a result, when a bonding wire (not illustrated in the drawings) is connected to each of the first electrode pads PD1, the second semiconductor chip CHP21 does not interfere. The number of first electrode pads PD1 and a shape thereof are not limited particularly. The number of first electrode pads PD1 is two or more, for example. The shape of the first electrode pad PD1 is a substantially rectangular shape or a substantially circular shape, for example.

The first protective layer PL1 is formed directly on the third insulating layer IL3. The first protective layer PL1 is an insulating film that protects the first semiconductor chip CHP1 from external moisture or the like. The first protective layer PL1 is formed on the third insulating layer IL3 so as to cover the first electrode pads PD1. A pad opening POP by which a part of the corresponding first electrode pad PD1 is exposed from the first protective layer PL1 is formed in the first protective layer PL1. A wiring such as the bonding wire is connected to the corresponding first electrode pad PD1 via the pad opening POP. The first protective layer PL1 has one or both of a silicon oxide film and a silicon nitride film, for example.

The second semiconductor chip CHP21 is arranged on the first semiconductor chip CHP1 via the adhesive layer DAF. In a plan view, the second semiconductor chip CHP21 is included in the first semiconductor chip CHP1. The second semiconductor chip CHP21 includes a second semiconductor substrate SUB2, an insulating film IF, a second transistor Tr2, a second wiring layer WL21, and a second protective layer PL2.

The second semiconductor substrate SUB2 has a third surface SF3 (principal surface) and a fourth surface SF4 opposite to the third surface SF3. The third surface SF3 of the second semiconductor substrate SUB2 is located on the second wiring layer WL21 side (will be described later). The second transistor Tr2 is formed on the third surface SF3 of the second semiconductor substrate SUB2. Material of the second semiconductor substrate SUB2 is monocrystalline silicon (Si), for example. The third surface SF3 of the second semiconductor substrate SUB2 faces the first surface SF1 of the first semiconductor substrate SUB1.

The second semiconductor substrate SUB2 is formed on the second wiring layer WL21. The second semiconductor substrate SUB2 has first openings OP1 respectively formed at positions corresponding to second electrode pads PD2. In a plan view, the first openings OP1 respectively overlap with the second electrode pads PD2. An inner surface of the second semiconductor substrate SUB2, which is an inner surface of each of the first openings OP1, may be perpendicular to or inclined with respect to the third surface SF3 of the second semiconductor substrate SUB2. It is preferable that the inner surface of the second semiconductor substrate SUB2 is inclined with respect to the third surface SF3 of the second semiconductor substrate SUB2. For example, it is preferable that an angle (inner angle) formed by the inner surface of the second semiconductor substrate SUB2 and the third surface SF3 of the second semiconductor substrate SUB2 is about 50° or more and 55° or less. As a result, a bonding wire (not illustrated in the drawings) connected to the second electrode pad PD2 hardly comes into contact with the second semiconductor substrate SUB2. For example, it is preferable that a crystal plane of the inner surface of the second semiconductor substrate SUB2 is a (111) plane. In this case, the first openings OP1 are formed by wet etching easily and with high accuracy. In the present embodiment, a size of each of the first openings OP1 is larger than a size of each of second openings OP2. As a result, when the bonding wire is connected to the second electrode pad PD2, the second semiconductor substrate SUB2 does not interfere. For example, it is preferable that in the X direction, an interval between the first opening OP1 and the corresponding second opening OP2 on a contact surface of the second semiconductor substrate SUB2 and the first wiring layer WL1 (a fourth insulating layer IL41) is about 100 μm.

The insulating film IF is formed on the fourth surface SF4 of the second semiconductor substrate SUB2. A thickness of the insulating film IF is 100 nm or thicker and 1 μm or thinner, for example. Material of the insulating film IF is silicon oxide, for example. A third opening OP3 that communicates with the corresponding first opening OP1 is formed in the insulating film IF. The insulating film IF functions as an etching mask when the first openings OP1 are formed in the second semiconductor substrate SUB2. For this reason, a size and a shape of each of the third openings OP3 are similar to the size and a shape of each of the first openings OP1 on a contact surface between the second semiconductor substrate SUB2 and the insulating film IF, for example.

The second transistor Tr2 may be included in the driving circuit DC, for example. The second transistor Tr2 is configured by the gate insulating film GI, the gate electrode GE, the source region SR, and the drain region DR. The gate electrode GE is formed on the second semiconductor substrate SUB2 via the gate insulating film GI. In a plan view, the source region SR and the drain region DR are respectively formed at both sides of the gate electrode GE.

The second wiring layer WL21 is formed on the third surface SF3 of the second semiconductor substrate SUB2. The second wiring layer WL21 is formed on the first wiring layer WL1 via the adhesive layer DAF. The second wiring layer WL21 is configured by two or more wiring layers. The second wiring layer WL21 is a layer that includes one or both of an insulating layer, and a wiring and a via (referred to also as a "plug") formed in the insulating layer. Here, the wiring is a conductor for transmitting an electric signal.

The second wiring layer WL21 includes the fourth insulating layer IL41, a fifth insulating layer IL5, the second inductors IND2, a sixth insulating layer IL6, a second via (or a second plug) V2, a second wiring WR2, the second electrode pad PD2, and a pad support member PSM. The pad support member PSM includes a first support via SV1, a first support wiring SWR1, a second support via SV2, and a second support wiring SWR2.

The fourth insulating layer IL41 is formed on the third surface SF3 of the second semiconductor substrate SUB2. A thickness of the fourth insulating layer IL41 is 1 μm or thicker and 3 μm or thinner, for example. Material of the fourth insulating layer IL41 is silicon oxide, for example. The fourth insulating layer IL41 has the second openings OP2 by each of which a part of the corresponding second electrode pad PD2 is exposed. The second opening OP2 exposes a part of the corresponding second electrode pad PD2 located at the second semiconductor substrate SUB2 side. The second openings OP2 respectively communicate with the first openings OP1.

The size and a shape of each of the second openings OP2 is not limited particularly so long as a bonding wire (not illustrated in the drawings) is connected to the corresponding second electrode pad PD2. In a plan view, the size of each of the second openings OP2 may be the same as the size of each of the first openings OP1, or may be smaller than the size of each of the first openings OP1. In the present embodiment, the size of each of the second openings OP2 is smaller than the size of each of the first openings OP1. The size (an opening size) of each of the second openings OP2 is about 100 μm, for example.

The fifth insulating layer IL5 is formed on the fourth insulating layer IL41. Examples of a thickness and material of the fifth insulating layer IL5 are similar to those of the fourth insulating layer IL41.

The second inductors IND2 are formed directly on the fifth insulating layer IL5. In the Z direction, the second inductors IND2 face the first inductors IND1 via the third insulating layer IL3, the first protective layer PL1, the adhesive layer DAF, the sixth insulating layer IL6, and the second protective layer PL2. A conductive member made of metal or semiconductor is not arranged between the first inductors IND1 and the second inductors IND2. For this reason, although details thereof will be described later, it is possible to suppress a signal from being deteriorated when the signal is transmitted between the first inductors IND1 and the second inductors IND2. Each of the second inductors IND2 is electrically connected to the second transistor Tr2. In a plan view, the shape of each of the second inductors IND2 is a spiral shape, for example. The material of the second inductor IND2 is aluminum or copper, for example.

The sixth insulating layer IL6 is formed on the fifth insulating layer IL5 so as to cover the second inductors IND2. Examples of a thickness and material of the sixth insulating layer IL6 are similar to those of the fourth insulating layer IL41.

The second via V2 is formed in the fourth insulating layer IL41 so as to reach the source region SR or the drain region DR. Although it is not illustrated in the drawings particularly, the second via V2 may be formed in the fifth insulating layer IL5 or the sixth insulating layer IL6 so as to connect two wirings respectively formed in different insulating layers to each other. Examples of material of the via V2 are similar to those of the first via V1.

The second wiring WR2 is formed on the fourth insulating layer IL41. The second wiring WR2 may be formed on the fifth insulating layer IL5 or the sixth insulating layer IL6. With respect to the second wiring WR2, a known configuration adopted as a wiring in the semiconductor technology can be adopted. Examples of material of the second wiring WR2 are similar to those of the first wiring WR1.

The second electrode pad PD2 is formed directly on the fourth insulating layer IL41. The second electrode pad PD2 is electrically connected to each of the second inductors IND2 and the second transistor Tr2. The number of second electrode pads PD2 and a shape of the second electrode pad PD2 are not limited particularly. The number of second electrode pads PD2 is two or more, for example. The shape of the second electrode pad PD2 is a substantially rectangular shape or a substantially circular shape, for example. In a plan view, the second electrode pad PD2 overlaps with the corresponding first opening OP1, the corresponding second opening OP2, and the corresponding third opening OP3. A bonding wire (not illustrated in the drawings) is connected to the second electrode pad PD2 via the corresponding first opening OP1, the corresponding second opening OP2, and the corresponding third opening OP3.

The pad support member PSM supports the second electrode pad PD2. This makes it possible to heighten strength of the second electrode pad PD2 against an impact that is generated at the time of bonding. The pad support member PSM overlaps with the second electrode pad PD2 in a plan view. The pad support member PSM includes the first support via SV1, the first support wiring SWR1, the second support via SV2, and the second support wiring SWR2.

The first support via SV1 is formed in the fourth insulating layer IL41 so as to connect the second electrode pad PD2 and the first support wiring SWR1 to each other. The first support via SV1 is formed between the second electrode pad PD2 and the first support wiring SWR1. The number of first support vias SV1 is not limited particularly, and is two or more, for example. Examples of material of the first support via SV1 are similar to those of the via V2.

The first support wiring SWR1 is formed on the fifth insulating layer IL5. Examples of material of the first support wiring SWR1 are similar to those of the second wiring WR2.

The second support via SV2 is formed in the fifth insulating layer IL5 so as to connect the first support wiring SWR1 and the second support wiring SWR2 to each other. The second support via SV2 is formed between the first support wiring SWR1 and the second support wiring SWR2. The number of second support vias SV2 is not limited particularly, and is two or more, for example. Examples of material of the second support via SV2 are similar to those of the via V2.

The second support wiring SWR2 is in direct contact with the second support via SV2. The second support wiring SWR2 is covered with the second protective layer PL2. The second support wiring SWR2 is formed on the sixth insulating layer IL6. Examples of material of the second support wiring SWR2 are similar to those of the second wiring WR2.

The second protective layer PL2 is formed directly on the sixth insulating layer IL6. The second protective layer PL2 is an insulating film that protects the second semiconductor chip CHP21 from external moisture and the like. The second protective layer PL2 is formed on the sixth insulating layer IL6. An opening is not formed in the second protective layer PL2. Examples of material of the second protective layer PL2 are similar to those of the first protective layer PL1.

In the present embodiment, in the Z direction, the pad support member PSM is formed so as to connect the second electrode pad PD2 and the second protective layer PL2 to each other. Namely, in the Z direction, the pad support member PSM is formed so as to reach the second protective layer PL2. This makes it possible to absorb an impact against the bonding by the second protective layer PL2 in a bonding step with respect to the second electrode pad PD2.

The adhesive layer DAF is arranged on the first semiconductor chip CHP1. The adhesive layer DAF is sandwiched between the first semiconductor chip CHP1 and the second semiconductor chip CHP21. Material of the adhesive layer DAF has an insulation property. The material of the adhesive layer DAF is resin, for example.

(Method of Manufacturing Semiconductor Device)

Next, one example of a method of manufacturing the semiconductor device SD1 according to the first embodiment will be described. FIG. 6 to FIG. 10 are respectively sectional views illustrating one example of processes included in the method of manufacturing the semiconductor device SD1. Each of FIG. 6 to FIG. 10 corresponds to a sectional view taken along the line A-A of FIG. 2.

For example, the method of manufacturing the semiconductor device SD1 according to the first embodiment includes (1) a preparation step of the first semiconductor chip CHP1 and the second semiconductor chip CHP21', (2) a bonding step of the first semiconductor chip CHP1 and the second semiconductor chip CHP21', (3) a forming step of the third openings OP3, (4) a forming step of the first openings OP1, and (5) a forming step of the second openings OP2.

(1) Preparation of the First Semiconductor Chip CHP1 and the Second Semiconductor Chip CHP21'

Figure 6:
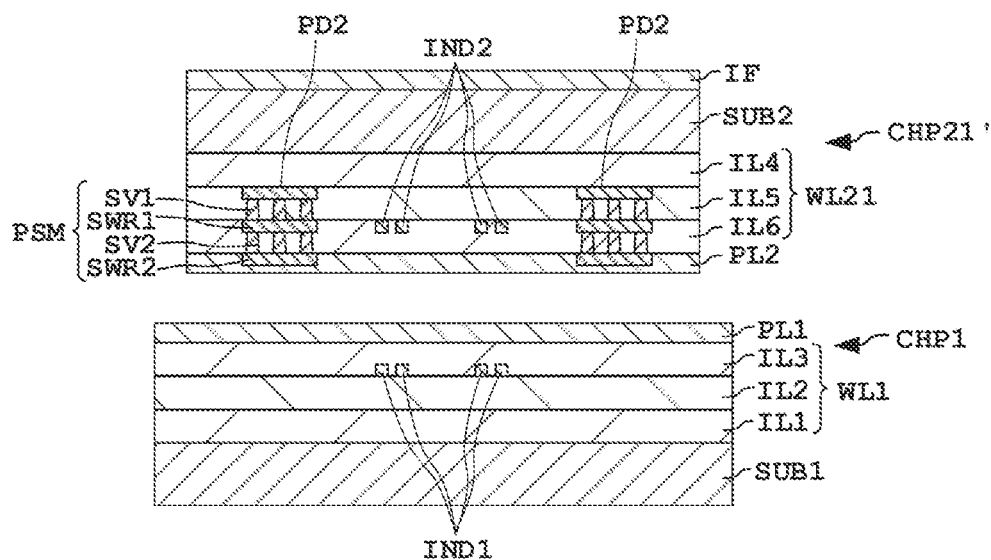
FIG. 6 is a sectional view illustrating one example of a process included in a method of manufacturing the semiconductor device according to the first embodiment.

As illustrated in FIG. 6, the first semiconductor chip CHP1 and the second semiconductor chip CHP21' are prepared. In the present step (1), a second electrode pad PD2 of the second semiconductor chip CHP21' does not expose to the outside. Namely, the first openings OP1 are formed in a second semiconductor substrate SUB2. The second openings OP2 are formed in the fourth insulating layer IL41. The third openings OP3 are not formed in the insulating film IF.

A method of forming each of the first insulating layer IL1, the second insulating layer IL2, the third insulating layer IL3, the fourth insulating layer IL41, the fifth insulating layer IL5, the sixth insulating layer IL6, the first protective layer PL1 and the second protective layer PL2 is a CVD method, for example. Each of the first inductors IND1, the second inductors IND2, the first electrode pads PD1, the second electrode pads PD2, the first wiring WR1, the second wiring WR2, the first support wiring SWR1, and the second support wiring SWR2 is formed by patterning a conducting film with a desired shape after the conducting film is formed by a sputtering method. Each of the first via V1, the second via V2, the first support via SV1, and the second support via SV2 is formed by filling a through hole with conductive material after the through hole is formed in the corresponding insulating layer.

(2) Bonding of the First Semiconductor Chip CHP1 and the Second Semiconductor Chip CHP21'

Figure 7:
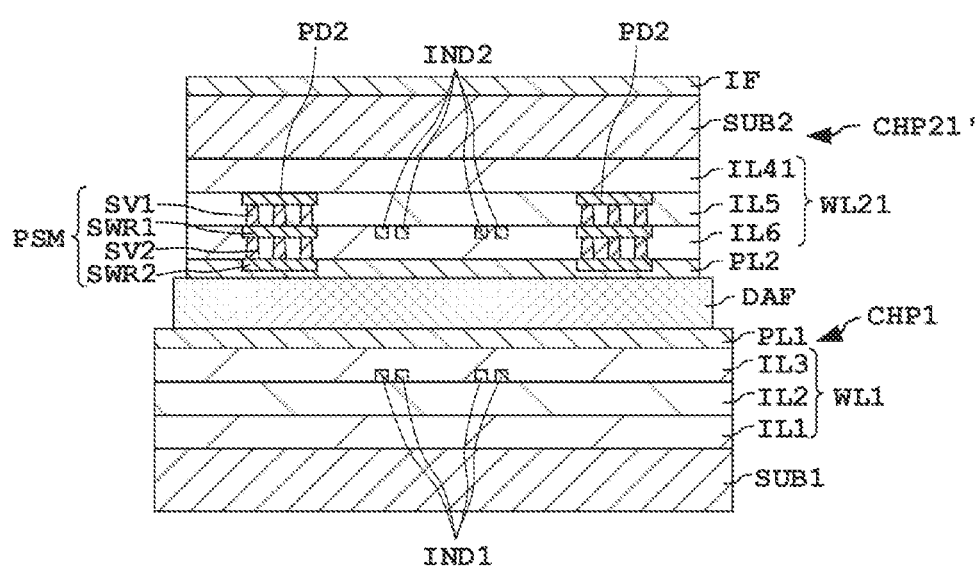
FIG. 7 is a sectional view illustrating one example of another process included in the method of manufacturing the semiconductor device according to the first embodiment.

Subsequently, as illustrated in FIG. 7, the first semiconductor chip CHP1 and the second semiconductor chip CHP21' are bonded to each other via the adhesive layer DAF. The adhesive layer DAF is sandwiched between the first semiconductor chip CHP1 and the second semiconductor chip CHP21' so that the first protective layer PL1 of the first semiconductor chip CHP1 and the adhesive layer DAF are in contact with each other and the second protective layer PL2 of the second semiconductor chip CHP21' and the adhesive layer DAF are in contact with each other. As a result, the first semiconductor chip CHP1 and the second semiconductor chip CHP21' are bonded to each other via the adhesive layer DAF.

(3) Forming of the Third Openings OP3

Subsequently, as illustrated in FIG. 8, the third openings OP3 are formed in the insulating film IF. The first openings OP1 are formed by a dry etching method, for example.

(4) Forming of the First Openings OP1

Subsequently, as illustrated in FIG. 9, the first openings OP1 are formed in the second semiconductor substrate SUB2. The first openings OP1 are respectively formed directly above the second electrode pads PD2. The first openings OP1 are formed by a dry etching method or a wet etching method, for example. In this case, the insulating film IF having the third openings OP3 may be used as an etching mask.

In a case where the first openings OP1 are formed by the wet etching method, an etching solution is potassium hydroxide (KOH) aqueous solution, tetramethylammonium hydroxide (TMAH) aqueous solution, ethylenediamine pyrocatechol (EDP) aqueous solution, hydrazine ($N_2H_4$) aqueous solution, sodium hydroxide aqueous solution, or cesium hydroxide (CsOH) aqueous solution, for example.

In a case where the first openings OP1 are formed by the wet etching method, an etching rate differs depending upon crystal orientation. As a result, a (111) surface of the second semiconductor substrate SUB2 is exposed in each of the first openings OP1. As a result, a shape of each of the first openings OP1 when viewed by a sectional view is a so-called trapezoidal shape. Namely, the size of each of the first openings f is continuously large as it is closer to the fourth surface SF4 from the third surface SF3 of the second semiconductor substrate SUB2. The size of each of the first openings OP1 is large as it is farther from the second electrode pad PD2. In this case, an angle (inner angle) formed by the inner surface of the second semiconductor substrate SUB2 and the third surface SF3 of the second semiconductor substrate SUB2 is 50° or more and 55° or less. This makes it possible to presume that a penetrating portion PP is formed by a wet etching method.

(5) Forming of the Second Openings OP2

Figure 10:
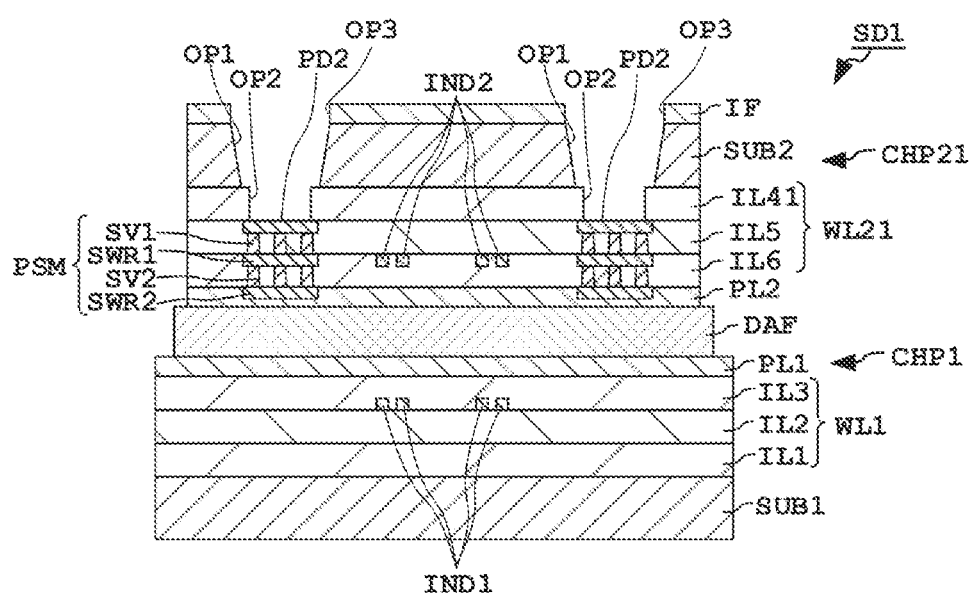
FIG. 10 is a sectional view illustrating one example of a process included in a method of manufacturing a semiconductor device SD1.

Subsequently, as illustrated in FIG. 10, the second openings OP2 are formed in the fourth insulating layer IL41. The second openings OP2 are formed by a dry etching method, for example.

By the manufacturing method described above, it is possible to manufacture the semiconductor device SD1 that has the first semiconductor chip CHP1 and the second semiconductor chip CHP21.

(Effects)

In the semiconductor device SD1 according to the first embodiment, the second electrode pads PD2 respectively overlap with the first openings OP1 formed in the second semiconductor substrate SUB2, and is exposed from the second semiconductor substrate SUB2. In a plan view, the first electrode pads PD1 are formed so as not to overlap with the second semiconductor chip CHP21. As a result, in the semiconductor device SD1, the first electrode pads PD1 and the second electrode pads PD2 can be exposed toward the same direction (the Z direction) with each other. In a case where the first electrode pads PD1 and the second electrode pads PD2 are exposed in opposite directions to each other (the Z direction and a −Z direction), it is necessary to turn back the semiconductor device SD1 when the bonding wires are respectively connected to the second electrode pads PD2 after the bonding wires are respectively connected to the first electrode pads PD1. On the other hand, in the present embodiment, the first electrode pads PD1 and the second electrode pads PD2 are exposed toward the same direction (the Z direction) to each other. Therefore, it is possible to connect the bonding wire to each of the first electrode pads PD1 and the second electrode pad PD2 without turning back the semiconductor device SD1. Namely, it is possible to simplify an assembling process of the semiconductor device SD1 according to the first embodiment. Further, unlike the semiconductor device described in the prior art document, there is no need to form the semiconductor device SD1 so that a part of the first semiconductor chip CHP1 does not overlap with a part of the second semiconductor chip CHP21. Therefore, it is possible to miniaturize the semiconductor device SD1.

Moreover, only the third insulating layer IL3, the first protective layer PL1, the adhesive layer DAF, the second protective layer PL2, and the sixth insulating layer IL6, each of which has an insulation property, are formed between the first inductors IND1 and the second inductors IND2. Namely, any conductive layer made of metal (for example, the wiring) or semiconductor (for example, the semiconductor substrate) is not formed between the first inductors IND1 and the second inductors IND2. If a semiconductor substrate is formed between the first inductors IND1 and the second inductors IND2, an eddy current is generated in the semiconductor substrate due to a magnetic field caused by the first inductors IND1 and the second inductors IND2. As a result, magnetic coupling force between the first inductors IND1 and the second inductors IND2 is weakened, and this deteriorates communication accuracy of a signal. On the other hand, in the present embodiment, since only the layers with the insulation property are formed between the first inductors IND1 and the second inductors IND2, the communication accuracy of the signal is high. As a result, in the first embodiment, it is also possible to heighten characteristics of the semiconductor device SD1.

First Modification Example

Figure 11:
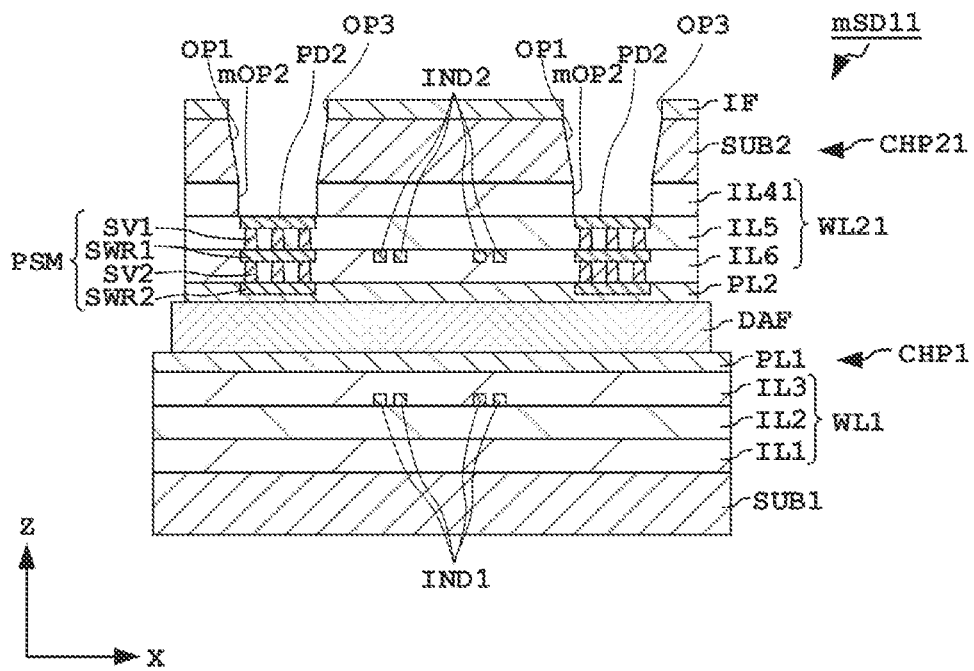
FIG. 11 is a plan view illustrating one example of a configuration of a main part of a semiconductor device according to a first modification example of the first embodiment.

FIG. 11 is a plan view illustrating one example of a configuration of a main part of a semiconductor device mSD11 according to a first modification example of the first embodiment.

In the semiconductor device mSD11, a size of each of the first openings OP1 on the contact surface of the second semiconductor substrate SUB2 and the second wiring layer WL2 (the fourth insulating layer IL41) is the same as a size of each of second openings mOP2. In the first modification example, for example, the second openings mOP2 are formed in the fourth insulating layer IL41 by using the second semiconductor substrate SUB2 having the first openings OP1 as an etching mask. In the first modification example, since the size of each of the first openings OP1 and the size of each of the second openings mOP2 on the contact surface described above are the same as each other, the second semiconductor substrate SUB2 can be used as the mask. As a result, the first modification example is preferable from the viewpoint of processing accuracy.

Second Modification Example

Figure 12:
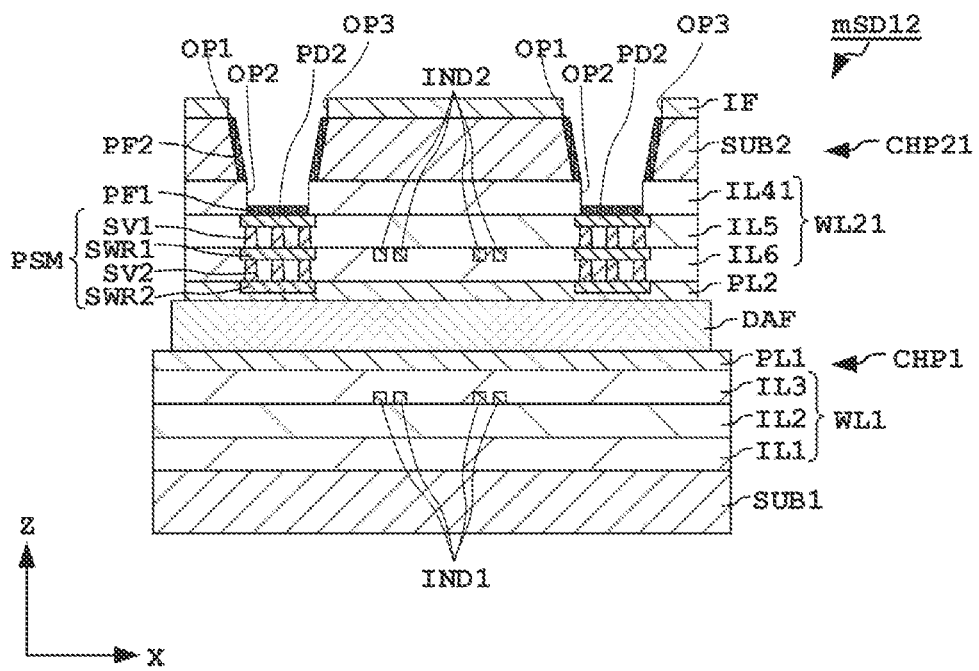
FIG. 12 is a plan view illustrating one example of a configuration of a main part of a semiconductor device according to a second modification example of the first embodiment.

FIG. 12 is a plan view illustrating one example of a configuration of a main part of a semiconductor device mSD12 according to a second modification example of the first embodiment.

In the semiconductor device mSD12, a first plating film PF1 is formed on a surface of the second electrode pad PD2, which is located on the second semiconductor substrate SUB2 side, of the second electrode pads PD2. Further, a second plating film PF2 is formed on the inner surface of the second semiconductor substrate SUB2. A method of manufacturing the semiconductor device mSD12 according to the second modification example includes, after the forming step of the second openings OP2, a plating step of forming a first plating film PF1 on the surface described above of the second electrode pad PD2 by a plating method and forming a second plating film PF2 on the inner surface of the second semiconductor substrate SUB2.

From the viewpoint of suppressing the first plating film PF1 and the second plating film PF2 from being electrically conducted with each other, it is preferable that an interval between the first plating film PF1 and the second plating film PF2 is large. It is preferable that the size of each of the first openings OP1 on the contact surface between the second semiconductor substrate SUB2 and the second wiring layer WL2 (the fourth insulating layer IL41) is larger than the size of each of the second openings OP2.

By forming the first plating film PF1 on the surface described above of the second electrode pad PD2, it is possible to further heighten bondability thereof. By forming the second plating film PF2 on the inner surface of the second semiconductor substrate SUB2, the inner surface of the second semiconductor substrate SUB2 can be protected.

Third Modification Example

Figure 13:
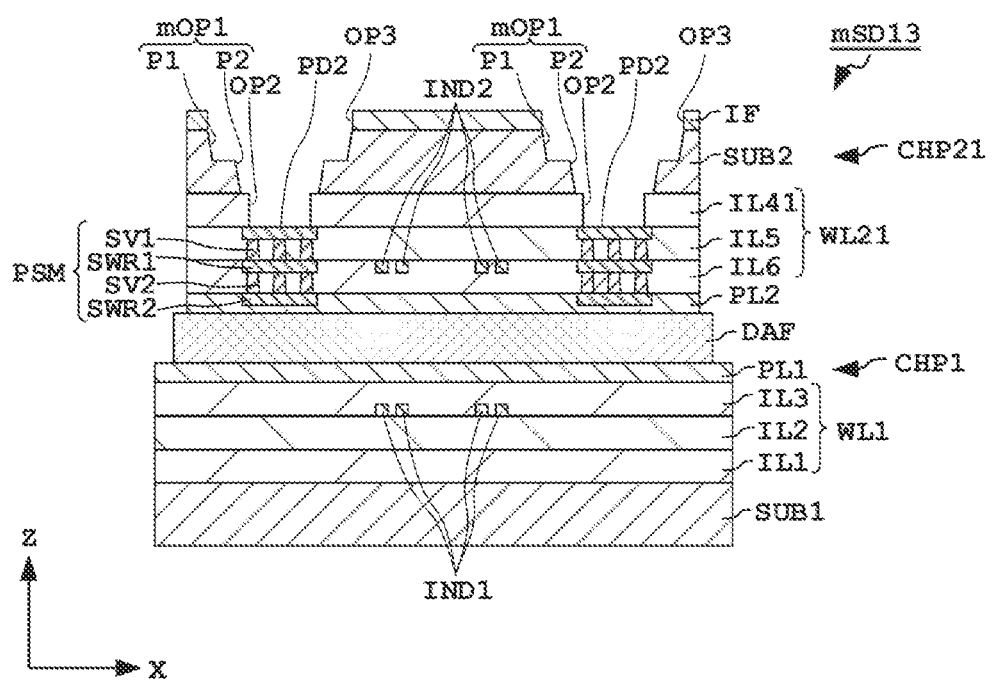
FIG. 13 is a plan view illustrating one example of a configuration of a main part of a semiconductor device according to a third modification example of the first embodiment.

FIG. 13 is a plan view illustrating one example of a configuration of a main part of a semiconductor device mSD13 according to a third modification example of the first embodiment.

In the semiconductor device mSD13, first openings mOP1 formed in the second semiconductor substrate SUB2 has a first portion P1 and a second portion P2. The first portion P1 and the second portion P2 communicate with each other. In the second semiconductor substrate SUB2, the first portion P1 of each of the first openings mOP1 is formed at the third surface SF3 side. In the second semiconductor substrate SUB2, the second portion P2 of each of the first openings mOP1 is formed at the fourth surface SF4 side. In the X direction, a size of the second portion P2 is larger than a size of the first portion P1. This makes it possible to more surely reduce a direct contact between a bonding wire and the second semiconductor substrate SUB2 when the bonding wire is connected to the second electrode pad PD2.

Second Embodiment

In a semiconductor module SM2 and a semiconductor device SD2 according to a second embodiment, a configuration of a second semiconductor chip CHP22 is different from the semiconductor module SM1 and the semiconductor device SD1 according to the first embodiment. Thus, hereinafter, the same reference numerals are respectively assigned to the same components as the semiconductor module SM1 and the semiconductor device SD1 according to the first embodiment, and explanation thereof will be omitted.

Figure 14:
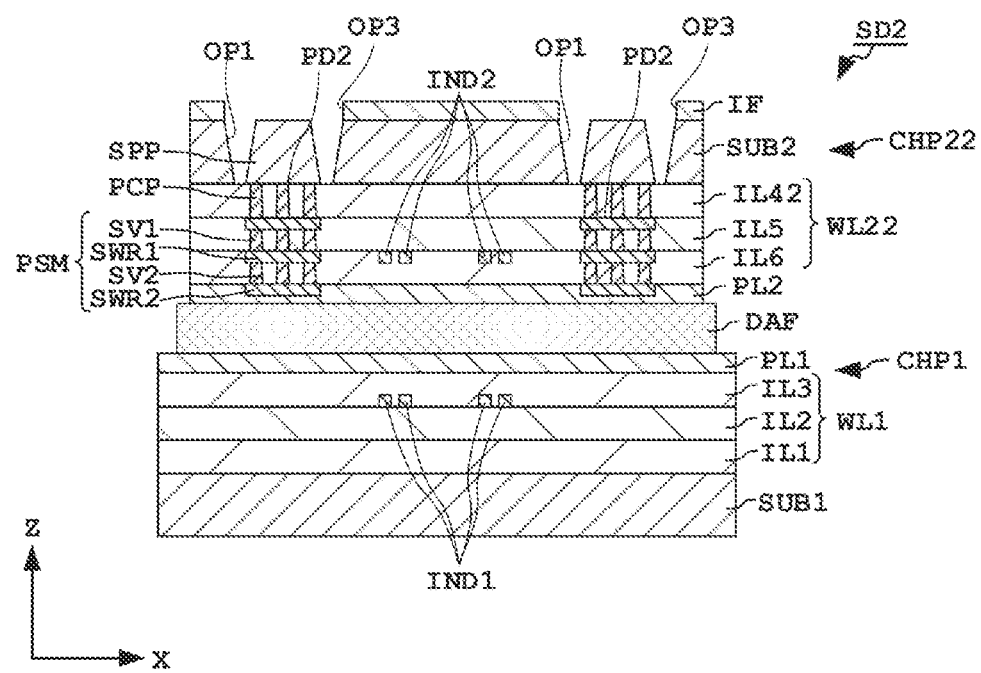
FIG. 14 is a plan view illustrating one example of a configuration of a main part of a semiconductor device according to a second embodiment.

FIG. 1 is a block diagram illustrating one example of a configuration of the semiconductor module SM2 according to the second embodiment. FIG. 14 is a plan view illustrating one example of a configuration of a main part of the semiconductor device SD2.

As illustrated in FIG. 1, the semiconductor module SM2 includes the semiconductor device SD2, an inverter INV, and a load LD. The semiconductor device SD2 has a first semiconductor chip CHP1 and a second semiconductor chip CHP22.

The second semiconductor chip CHP22 includes a second semiconductor substrate SUB2, an insulating film IF, a second transistor Tr2, a second wiring layer WL22, and a second protective layer PL2. The second wiring layer WL22 includes semiconductor pad portions SPP, pad connecting portions PCP, a fourth insulating layer IL42, a fifth insulating layer IL5, second inductors IND2, a sixth insulating layer IL6, a second via V2, a second wiring WR2, a second electrode pad PD2, and a pad support member PSM. The pad support member PSM includes first support vias SV1, a first support wiring SWR1, second support vias SV2, and a second support wiring SWR2.

The semiconductor pad portions SPP are respectively formed in first openings OP1 of the second semiconductor substrate SUB2. In a plan view, each of the semiconductor pad portions SPP is separated from an inner surface of the second semiconductor substrate SUB2. In a plan view, each of the semiconductor pad portions SPP is surrounded by the inner surface of the second semiconductor substrate SUB2. The semiconductor pad portions SPP are formed on the fourth insulating layer IL42. The second transistor Tr2 is formed on a third surface SF3 of the second semiconductor substrate SUB2, while any semiconductor element such as the second transistor Tr2 is not formed on a surface of each of the semiconductor pad portions SPP. Each of the semiconductor pad portions SPP has a conductive property, and functions as an electrode pad. Each of the semiconductor pad portions SPP may be a p-type semiconductor portion, or may be an n-type semiconductor portion. Each of the semiconductor pad portions SPP is separated from the second semiconductor substrate SUB2. The semiconductor pad portions SPP are exposed from the second semiconductor substrate SUB2. A shape of the semiconductor pad portion SPP in a plan view may be a substantially rectangular shape, or may be a substantially circular shape.

A crystal plane of a side surface of each of the semiconductor pad portions SPP is a (111) surface, for example. In an X direction and a Y direction, the side surface of the corresponding semiconductor pad portion SPP faces the inner surface of the second semiconductor substrate SUB2. In this case, the semiconductor pad portions SPP and the first openings OP1 are formed by wet etching easily and with high accuracy. An inner angle formed by the side surface of each of the semiconductor pad portions SPP and a lower surface of the corresponding semiconductor pad portion SPP (a contact surface between the semiconductor pad portion SPP and the fourth insulating layer IL42) is 50° or more and 55° or less. Examples of material of the semiconductor pad portions SPP are similar to those of the second semiconductor substrate SUB2, for example. A thickness of each of the semiconductor pad portions SPP may be the same as a thickness of the second semiconductor substrate SUB2, or may be thinner than the thickness of the second semiconductor substrate SUB2. In the present embodiment, the thickness of the semiconductor pad portion SPP is the same as the thickness of the second semiconductor substrate SUB2.

The pad connecting portions PCP are formed in the fourth insulating layer IL42 so as to electrically connect each of the semiconductor pad portions SPP and the second electrode pads PD2 to each other. Examples of material of the pad connecting portions PCP are similar to those of the via V2.

The fourth insulating layer IL42 is similar to the fourth insulating layer IL41 according to the first embodiment except that the fourth insulating layer IL42 does not have second openings OP2, and that the pad connecting portions PCP are formed in the fourth insulating layer IL42.

(Method of Manufacturing Semiconductor Device)

Next, one example of a method of manufacturing the semiconductor device SD2 according to the second embodiment will be described. For example, the method of manufacturing the semiconductor device SD2 is mainly different from the method of manufacturing the semiconductor device SD1 according to the first embodiment in that the step (5) of the forming step of the second openings OP2 is not included therein.

A step (1) of the method of manufacturing the semiconductor device SD2 according to the second embodiment is similar to the step (1) according to the first embodiment except that the pad connecting portions PCP are formed in the fourth insulating layer IL42 in the second embodiment. The pad connecting portions PCP are formed by forming through holes in the fourth insulating layer IL42 and then filling the through holes with conductive material.

A step (4) of the method of manufacturing the semiconductor device SD2 according to the second embodiment is similar to the step (4) according to the first embodiment except that the second semiconductor substrate SUB2 is patterned so that the semiconductor pad portions SPP remain.

By the manufacturing method described above, the semiconductor device SD2 that has the first semiconductor chip CHP1 and the second semiconductor chip CHP22 can be manufactured.

(Effects)

The second embodiment achieves the similar effects to those of the first embodiment. In addition, the semiconductor device SD2 according to the second embodiment, wire bonding is connected directly to each of the semiconductor pad portions SPP formed on the second electrode pad PD2. Namely, the wire bonding (not illustrated in the drawings) is indirectly connected to the second electrode pads PD2. For this reason, it is possible to more surely suppress the wire bonding and the second semiconductor substrate SUB2 from coming into contact with each other as compare with a case where the wire bonding is directly connected to the second electrode pad PD2.

First Modification Example

Figure 15:
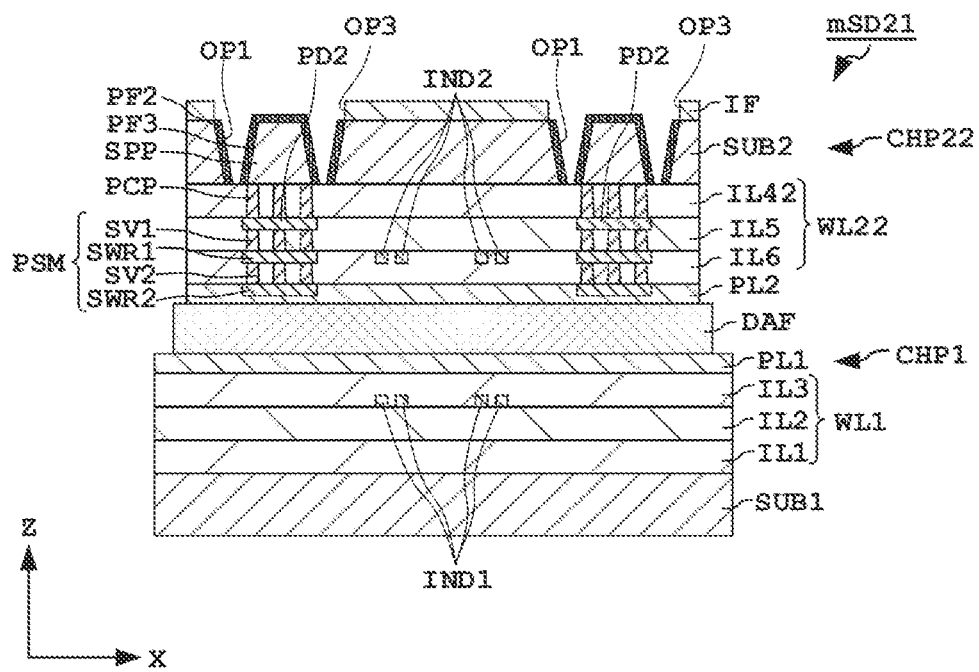
FIG. 15 is a plan view illustrating one example of a configuration of a main part of a semiconductor device according to a first modification example of the second embodiment.

FIG. 15 is a plan view illustrating one example of a configuration of a main part of a semiconductor device mSD21 according to a first modification example of the second embodiment.

In the semiconductor device mSD21, a third plating film PF3 is formed on a surface of each of the semiconductor pad portions SPP. The third plating film PF3 is formed on an upper surface and a side surface of each of the semiconductor pad portions SPP. Further, a second plating film PF2 is formed on the inner surface of the second semiconductor substrate SUB2. A method of manufacturing the semiconductor device mSD21 according to the first modification example includes, after the step of forming the first openings OP1, a plating step of forming a third plating film PF3 on the surface of each of the semiconductor pad portions SPP by a plating method and forming a second plating film PF2 on the inner surface of the second semiconductor substrate SUB2.

From the viewpoint of suppressing the second plating film PF2 and the third plating film PF3 from being conducted with each other, it is preferable that an interval between the second plating film PF2 and the third plating film PF3 is large. For example, it is preferable that the interval between the second plating film PF2 and the third plating film PF3 is 10 times or more with respect to a thickness of each of the second plating film PF2 and the third plating film PF3.

By forming the third plating film PF3 on the surface of the semiconductor pad portion SPP, it is possible to further heighten bondability. This makes it possible to protect the inner surface of the second semiconductor substrate SUB2.

Second Modification Example

Figure 16:
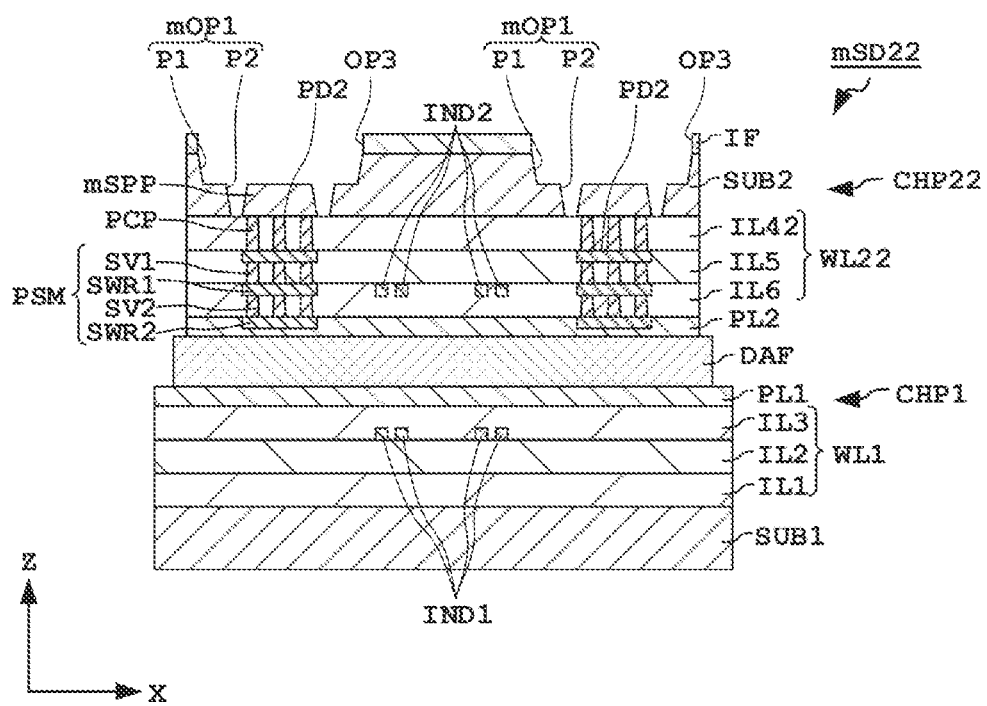
FIG. 16 is a plan view illustrating one example of a configuration of a main part of a semiconductor device according to a second modification example of the second embodiment.

FIG. 16 is a plan view illustrating one example of a configuration of a main part of a semiconductor device mSD22 according to a second modification example of the second embodiment.

In the semiconductor device mSD13, first openings mOP1 formed in the second semiconductor substrate SUB2 has a first portion P1 and a second portion P2. The first portion P1 and the second portion P2 communicate with each other. In the second semiconductor substrate SUB2, the first portions P1 of the first openings mOP1 are formed at the third surface SF3. In the second semiconductor substrate SUB2, the second portions P2 of the first openings mOP1 is formed at the fourth surface SF4. In the X direction, a size of the second portion P2 is larger than a size of the first portion P1. This makes it possible to more surely reduce a direct contact between a bonding wire and the second semiconductor substrate SUB2 when the bonding wire is connected to the second electrode pad PD2.

In the semiconductor device mSD22, each of the first openings mOP1 formed on the second semiconductor substrate SUB2 has a first portion P1 and a second portion P2. The first portion P1 and the second portion P2 communicate with each other. In the second semiconductor substrate SUB2, the first portions P1 of the first openings mOP1 are formed at the third surface SF3. In the second semiconductor substrate SUB2, the second portions P2 of the first openings mOP1 are formed at the fourth surface SF4. In the X direction, a size of the second portion P2 is larger than a size of the first portion P1. This makes it possible to more surely reduce a direct contact between a bonding wire and the second semiconductor substrate SUB2 when the bonding wire is connected to the second electrode pad PD2.

In the second modification example, semiconductor pad portions mSPP are respectively formed in the first openings OP1 so as not to be located in the first openings mOP1. In the Z direction, a thickness of the semiconductor pad portion mSPP is thinner than the thickness of the second semiconductor substrate SUB2. In the second modification example, it is possible to more surely reduce the direct contact between the bonding wire and the second semiconductor substrate SUB2 when the bonding wire is connected to the semiconductor pad portion mSPP.

Further, in the second semiconductor substrate SUB2, an impurity concentration of the first portion P1 located at the third surface SF3 side may be denser than an impurity concentration of the second portion P2 located at the fourth surface SF4 side. Further, an impurity concentration of the semiconductor pad portion mSPP may be the same as the impurity concentration of the first portion P1 of the second semiconductor substrate SUB2. In this case, the impurity concentration of the semiconductor pad portion mSPP is denser than the impurity concentration of the first portion P1 of the second semiconductor substrate SUB2. This makes it possible to reduce a resistance value of the semiconductor pad portion mSPP and heighten a function as an electrode pad.

Note that the present invention is not limited to the embodiments described above, and the present invention may be modified into various forms without departing from the substance thereof.

Further, even in a case where an example of a specific numeral value is described, the specific numeral may be a numeral value that exceeds the specific numeral value or may be a numeral value that is less than the specific numeral value except for a case where it is theoretically limited to the specific numeral value clearly. Further, a component has a meaning such as "B containing A as a main component", and does not exclude a mode containing other components.

Further, a part of one of the embodiments and the modification examples may be combined with another one thereof.

What is claimed is:

1. A semiconductor device comprising:
a first semiconductor chip;
an adhesive layer formed on the first semiconductor chip; and
a second semiconductor chip arranged on the first semiconductor chip via the adhesive layer,
wherein the first semiconductor chip includes:
a first semiconductor substrate; and
a first wiring layer formed on the first semiconductor substrate, the first wiring layer having a first inductor and a first electrode pad electrically connected to the first inductor,
wherein the second semiconductor chip includes:
a second wiring layer formed on the first wiring layer via the adhesive layer, the second wiring layer having a second inductor that faces the first inductor and second electrode pads each of which is connected to the second inductor;
a second semiconductor substrate formed on the second wiring layer, the second semiconductor substrate having first openings; and
a first plating film formed on a surface of one second electrode pad of the second electrode pads, the one second electrode pad being located at a side of the second semiconductor substrate,
wherein the first electrode pad is formed so as not to overlap with the second semiconductor chip in a plan view,
wherein the second electrode pads respectively overlap with the first openings in the plan view,
wherein the second wiring layer includes:
a first insulating layer formed on the second semiconductor substrate; and
the second electrode pads formed on the first insulating layer, each of the second electrode pads having a second opening that communicates with the corresponding first opening, and
wherein the second electrode pads respectively overlap with the first openings and the second openings in the plan view.

2. The semiconductor device according to claim 1,
wherein a size of each of the first openings is same as a size of each of the second openings on a contact surface between the second semiconductor substrate and the first insulating layer.

3. The semiconductor device according to claim 2,
wherein the second semiconductor substrate includes a first surface located at a side of the second wiring layer and a second surface opposite to the first surface,
wherein each of the first openings includes:
a first portion formed at a side of the first surface of the second semiconductor substrate; and
a second portion formed at a side of the second surface of the second semiconductor substrate, and
wherein a size of the first portion of each of the first openings is larger than a size of the second portion of the corresponding first opening.

4. The semiconductor device according to claim 1,
wherein a size of each of the first openings is larger than a size of each of the second openings on a contact surface between the second semiconductor substrate and the first insulating layer.

5. The semiconductor device according to claim 1, further comprising:
a second plating film formed on an inner surface of the second semiconductor substrate.

6. The semiconductor device according to claim 1,
wherein a size of each of the first openings is larger as the first opening is farther from the corresponding second electrode pad.

7. The semiconductor device according to claim 1,
wherein the first semiconductor chip overlaps with the whole the second semiconductor chip in a plan view.

8. A semiconductor device comprising:
a first semiconductor chip;
an adhesive layer formed on the first semiconductor chip; and
a second semiconductor chip arranged on the first semiconductor chip via the adhesive layer,
wherein the first semiconductor chip includes:
a first semiconductor substrate; and
a first wiring layer formed on the first semiconductor substrate, the first wiring layer having a first inductor and a first electrode pad electrically connected to the first inductor,
wherein the second semiconductor chip includes:
a second wiring layer formed on the first wiring layer via the adhesive layer, the second wiring layer having a second inductor that faces the first inductor and second electrode pads each of which is connected to the second inductor; and
a second semiconductor substrate formed on the second wiring layer, the second semiconductor substrate having first openings,
wherein the first electrode pad is formed so as not to overlap with the second semiconductor chip in a plan view,
wherein the second electrode pads respectively overlap with the first openings in the plan view
wherein the semiconductor device further comprises a semiconductor pad portion formed on the second wiring layer in each of the first openings,
wherein the second wiring layer includes:
a first insulating layer formed on the second semiconductor substrate, the first insulating layer having a first surface and a second surface opposite to the first surface;
the second electrode pads formed on the first insulating layer; and
a pad connecting portion formed in the first insulating layer so as to connect the semiconductor pad portion and the corresponding second electrode pad to each other,
wherein the semiconductor device further comprises a first plating film formed on an upper surface and a side surface of the semiconductor pad portion.

9. The semiconductor device according to claim 8, further comprising:
a second plating film formed on an inner surface of the second semiconductor substrate.

10. The semiconductor device according to claim 9,
wherein the second semiconductor substrate has a first surface located at the second wiring layer side and a second surface opposite to the first surface,
wherein each of the first opening includes:
a first portion formed at a side of the first surface of the second semiconductor substrate; and
a second portion formed at a side of the second surface of the second semiconductor substrate,
wherein a size of the first portion of each of the first openings is larger than a size of the second portion of the corresponding first opening, and wherein a thickness of the semiconductor pad portion is thinner than a thickness of the second semiconductor substrate.

11. The semiconductor device according to claim 8, wherein a size of each of the first openings is larger as the first opening is farther from the corresponding second electrode pad.

12. The semiconductor device according to claim 8, wherein the first semiconductor chip overlaps with the whole second semiconductor chip in a plan view.

* * * * *